(12) United States Patent
Tang et al.

(10) Patent No.: US 8,716,787 B2
(45) Date of Patent: May 6, 2014

(54) POWER SEMICONDUCTOR DEVICE AND FABRICATION METHOD THEREOF

(75) Inventors: Sung-Nien Tang, Hsinchu County (TW); Hsiu-Wen Hsu, Hsinchu County (TW)

(73) Assignee: Super Group Semiconductor Co., Ltd., New Taipei (TW)

( * ) Notice: Subject to any disclaimer, the term of this patent is extended or adjusted under 35 U.S.C. 154(b) by 92 days.

(21) Appl. No.: 13/431,063

(22) Filed: Mar. 27, 2012

(65) Prior Publication Data

US 2013/0256789 A1    Oct. 3, 2013

(51) Int. Cl.
*H01L 29/66*    (2006.01)
(52) U.S. Cl.
USPC .......................................................... 257/331
(58) Field of Classification Search
USPC ......... 257/331, 332, 341, 139, 146, 147, 328, 257/339, E21.382, E27.053, 7, 93, 334, 257/427, 444, 446, 491, 663, 713, 262, 257/368–401, E27.052, E27.079, 256, 287, 257/504, E27.148, E29.265, E29.314, 621, 257/774, E29.026, E29.027, E29.066, 257/E29.197, E29.201, E29.382; 438/135, 438/270, 524, 700, 186
See application file for complete search history.

(56) References Cited

U.S. PATENT DOCUMENTS

| | | | | |
|---|---|---|---|---|
| 5,665,996 | A * | 9/1997 | Williams et al. | 257/401 |
| 7,538,388 | B2 * | 5/2009 | Miura et al. | 257/331 |
| 8,253,163 | B2 * | 8/2012 | Kusunoki et al. | 257/139 |
| 8,581,336 | B2 * | 11/2013 | Long et al. | 257/331 |
| 2011/0233664 | A1 * | 9/2011 | Shiraishi et al. | 257/331 |
| 2012/0217541 | A1 * | 8/2012 | Hsieh | 257/140 |

* cited by examiner

*Primary Examiner* — Dao H Nguyen
*Assistant Examiner* — Tram H Nguyen
(74) *Attorney, Agent, or Firm* — Li & Cai Intellectual Property (USA) Office (57) ABSTRACT

A fabrication method of a power semiconductor device is provided. Firstly, a plurality of trenched gate structures is formed in the base. Then, a body mask is used for forming a pattern layer on the base. The pattern layer has at least a first open and a second open for forming at least a body region and a heavily doped region in the base respectively. Then, a shielding structure is formed on the base to fill the second open and line at least a sidewall of the first open. Next, a plurality of source doped regions is formed in the body region by using the pattern layer and the shielding structure as the mask. Then, an interlayer dielectric layer is formed on the base and a plurality of source contact windows is formed therein to expose the source doped regions.

13 Claims, 8 Drawing Sheets

POWER SEMICONDUCTOR DEVICE AND FABRICATION METHOD THEREOF

BACKGROUND OF THE INVENTION (1) Field of the Invention

This invention relates to a power semiconductor device and a fabrication method thereof, and more particularly relates to a fabrication of a power semiconductor device by using fewer masks to reduce cost.

(2) Description of the Prior Art

Price competition has become an important issue in semiconductor industry. In order to enhance product's competition, it is an effective way to reduce the number of masks applied in the fabrication process.

Generally, the fabrication process of a trenched power semiconductor device needs five masks for defining the location of gate trenches, body regions and termination regions, source doped regions, source contact window, and metal pattern. In present, some self-aligned technologies have been developed for reducing the number of masks. However, most of these self-aligned technologies are applied for defining the source doped regions and the source contact windows for reducing the number of masks. Seldom of the solutions can be applied to the lithographic steps for defining the other structures.

SUMMARY OF THE INVENTION

Accordingly, it is a main object of the present invention to provide a power semiconductor device and a fabrication method thereof for reducing the number of masks and the fabrication cost.

A fabrication method of a power semiconductor device is provided in an embodiment of the present invention. Firstly, a base is provided. Then, a plurality of trenched gate structures is formed in the base. Thereafter, by using a body mask, a pattern layer is formed on the base. The pattern layer has at least a first open and at least a second open for forming at least a body region and at least a heavily doped termination structure in the base respectively. An open width of the first open is wider than that of the second open. Thereafter, a shielding structure is formed on the base. The shielding structure fills the second open and covers at least a sidewall of the first open. Then, a plurality of source doped regions is formed in the body region by using an implantation mask composed of the pattern layer and the shielding structure. Thereafter, an interlayer dielectric layer is formed on the base. Then, a plurality of source contact windows is formed in the interlayer dielectric layer to penetrate the interlayer dielectric layer so as to expose the source doped regions. Afterward, a metal pattern layer is formed on the interlayer dielectric layer to connect the source doped regions.

According to an embodiment of the present invention, the trenched gate structures formed in the base is replaced by the planar gate structures formed on the base.

According to an embodiment of the present invention, the step of forming the gate structure is prior to the step of forming the pattern layer.

According to an embodiment of the present invention, the step of forming the gate structure is later than the step of forming the body region, and according to another embodiment, the step of forming the gate structure is later than the step of forming the source doped regions.

According to an embodiment, before the formation of the pattern layer, an etching stop layer is formed on the base for determined whether the etching step for forming the pattern layer is completed.

According to the fabrication method provided in the present invention, a power semiconductor device is also provided. The power semiconductor device has a base, a plurality of gate structures, a pattern layer, at least a body region, at least a heavily doped termination structure, a shielding structure, a plurality of source doped regions, an interlayer dielectric layer, and a metal pattern layer. The pattern layer covers the base and has at least a first open and at least a second open. An open width of the first open is greater than that of the second open. The body region is located in the base below the first open. The heavily doped structure is located in the base below the second open. The heavily doped structure is away from the body region. The shielding structure fills the second open and covers at least a sidewall of the first open. The source doped regions are located in a range of the body region defined by the pattern layer and the shielding structure. The interlayer dielectric layer is located on the base with a plurality of source contact windows penetrating the interlayer dielectric layer to expose the source doped regions. The metal pattern layer is located on the interlayer dielectric layer to connect the source doped regions.

According to an embodiment of the present invention, these gate structures are trenched gate structures located in the base.

According to an embodiment of the present invention, these gate structures are planar gate structures located on the base.

According to an embodiment of the present invention, an additional etching stop layer is interposed between the pattern layer and the base.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1A:
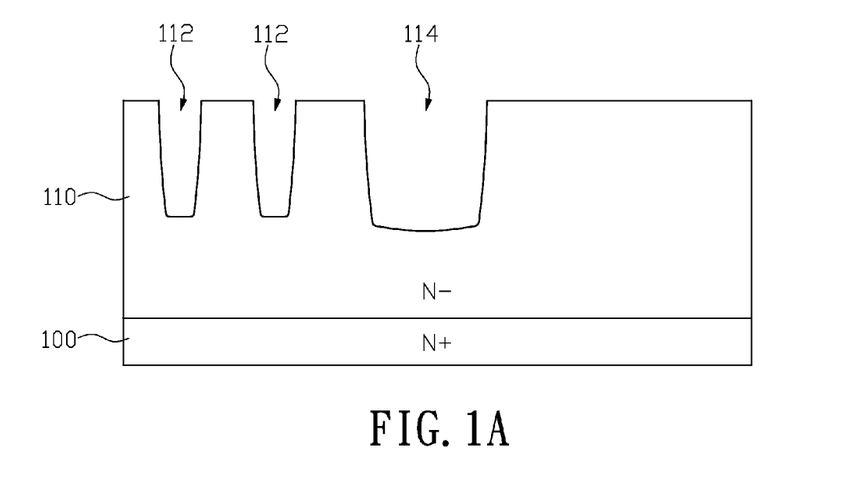
FIGS. 1A to 1G are schematic views showing a fabrication method of a power semiconductor device in accordance with a first embodiment of the present invention.

FIGS. 1A to 1G are schematic views showing a fabrication method of a power semiconductor device in accordance with a first embodiment of the present invention. As shown in FIG. 1A, firstly, an epitaxial layer 110 is formed on a heavily doped substrate 100 to form a semiconductor base. Then, a plurality of gate trenches 112 are formed in the epitaxial layer 110. As a preferred embodiment, the present step may be utilized for forming the first trench 114 as shown for defining the location of traces of the power semiconductor device.

Figure 1B:
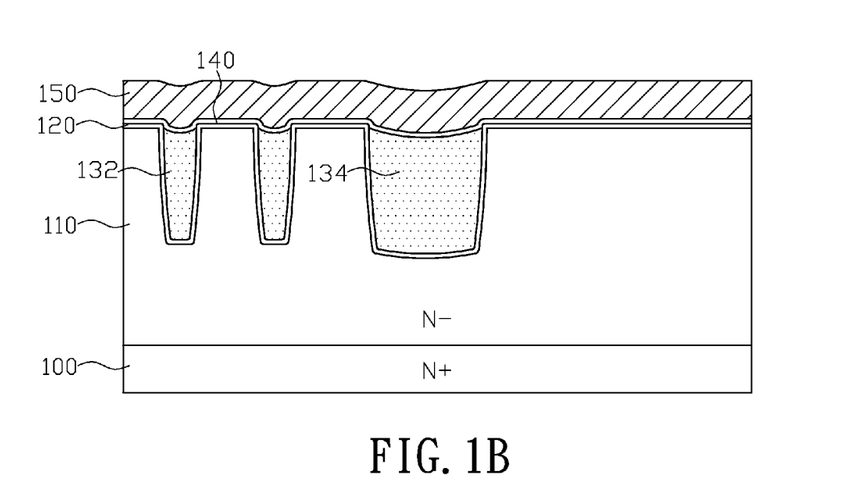

Then, as shown in FIG. 1B, a gate oxide layer 120 is formed on the inner surface of the gate trench 112. The gate oxide layer 120 also lines the inner surface of the first trench 114. Thereafter, the polysilicon gate structures 132 and the trace structure 134 are formed in the gate trenches 112 and the first trench 114 respectively.

Next, a pattern material layer 150 is formed on the epitaxial layer 110. In the present embodiment, an etching stop layer 140 is formed on the upper surface of the epitaxial layer 110 prior to the formation of the pattern material layer 150. The etching stop layer 140 and the pattern material layer 150 are composed of different materials such that the completeness of the etching step applied solely on the pattern material layer 150 can be determined by detecting the removed material in the etching step. As a preferred embodiment, the pattern material layer 150 may be composed of a material selected from a group composed of silicon oxide, silicon nitride, and polysilicon.

Figure 1C:
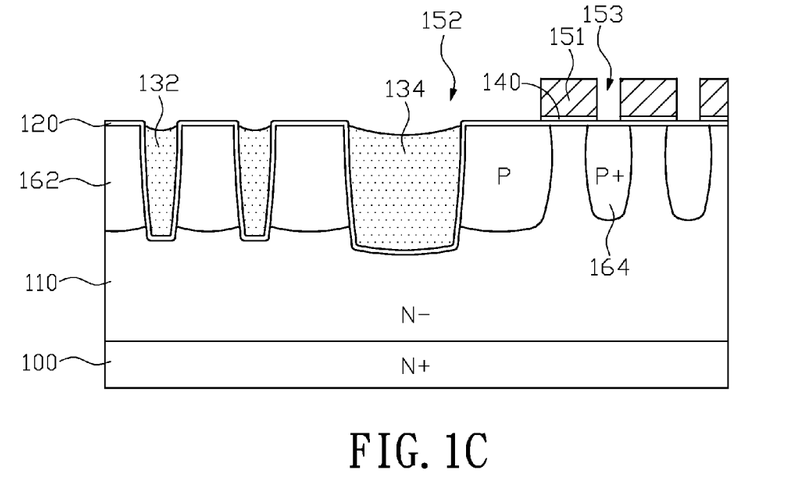

Next, as shown in FIG. 1C, a body mask (not shown) is used to define the locations of at least a body region 162 and at least a termination structure on the pattern material layer 150. Then, etching the pattern material layer 150 according the pattern defined by the body mask such that a pattern layer 151 is formed. The pattern layer 151 has at least a first open 152 and at least a second open 153 with respect to the body regions 162 and the termination structures 164 respectively. Two second opens 153 are formed in the pattern layer 151 of the present embodiment as shown.

The open width of the first open 152 is greater than that of the second open 153. Thereafter, by using the pattern layer 151 as an implantation mask, an ion implantation step is carried out to form the body region 162 and the heavily doped termination structures 164 in the epitaxial layer 110. The body region 162 surrounds the polysilicon gate structure 132 and is away from the heavily doped termination structure 164 for a predetermined distance.

Figure 1D:
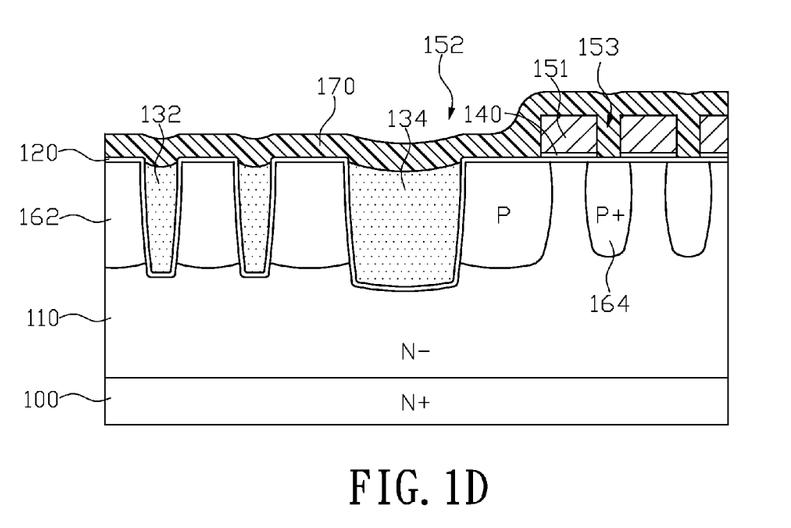
Figure 1E:
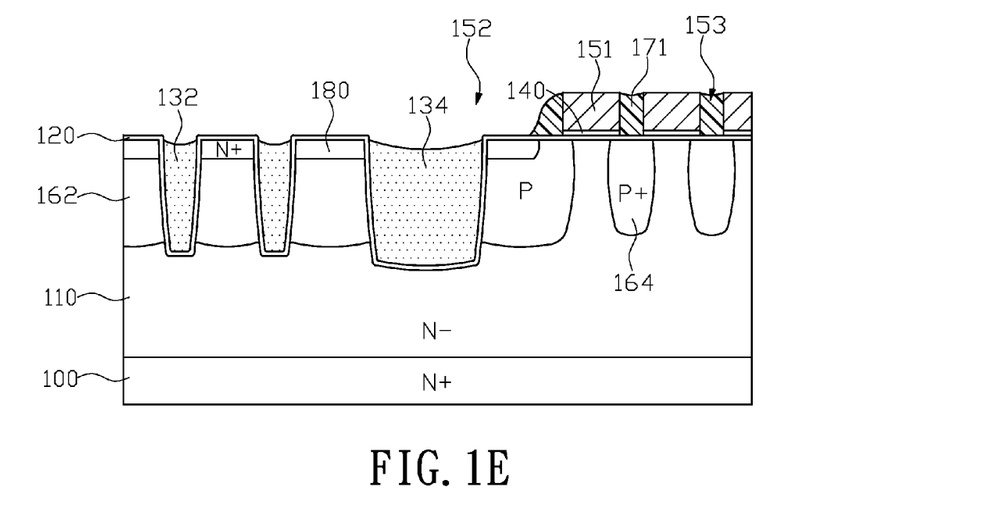

Next, as shown in FIG. 1D, a shielding layer 170 is deposited along the surface profile of the epitaxial layer 110 and the pattern layer 151. The shielding layer 170 covers the exposed surfaces of the epitaxial layer 110 and the pattern layer 151 and totally fills the second opens 153 of the pattern layer 151. Then, as shown in FIG. 1E, the shielding layer 170 is etched by using the anisotropic etching technology so as to form a shielding structure 171 on the epitaxial layer 110. The shielding structure 171 fills the second open 153 and has at least a portion lines by at least a sidewall of the first open 152 such that at least a portion of the bottom of the first open 152, or the upper surface of the body region, is not covered by the shielding structure 171.

Then, the pattern layer 151 and the shielding structure 171 are used as an implantation mask for implanting impurities into the body region 162 so as to form a plurality of source doped regions 180 therein. It is noted that since the bottom of the second open 153 is totally shielded by the shielding structure 171, the impurities would not be implanted into the heavily doped termination structure 164. In addition, since the shielding structure 171 has a portion lying on at least a sidewall of the first open 152, the resulted source doped regions 180 would be entirely located in the body region 162 and a sufficient distance between the source doped regions 180 and the edge of the body region 162 can be guaranteed.

As shown in FIG. 1E, the upper surface of the body region 162 is covered by a screen oxide layer for the following source ion implantation step. The screen oxide layer may be formed on the epitaxial layer 110 in the step of forming the gate oxide layer 120. It is understood that the upper surface of the body region 162 can be regarded as exposed for following the source ion implantation step even with a thin oxide layer formed thereon. In addition, according to another embodiment, the screen oxide layer may be removed prior to the ion implantation step, such as the etching step for forming the pattern layer 151.

Figure 1F:
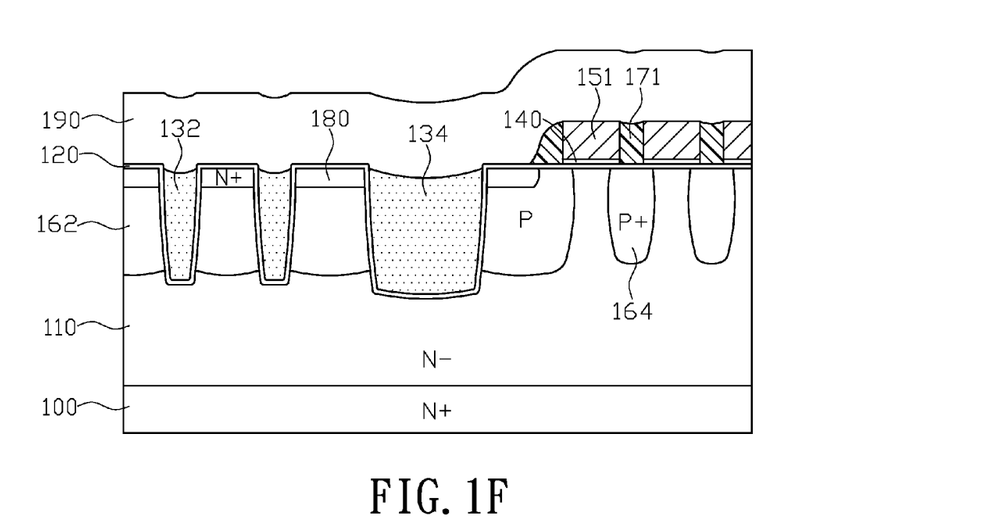
Figure 1G:
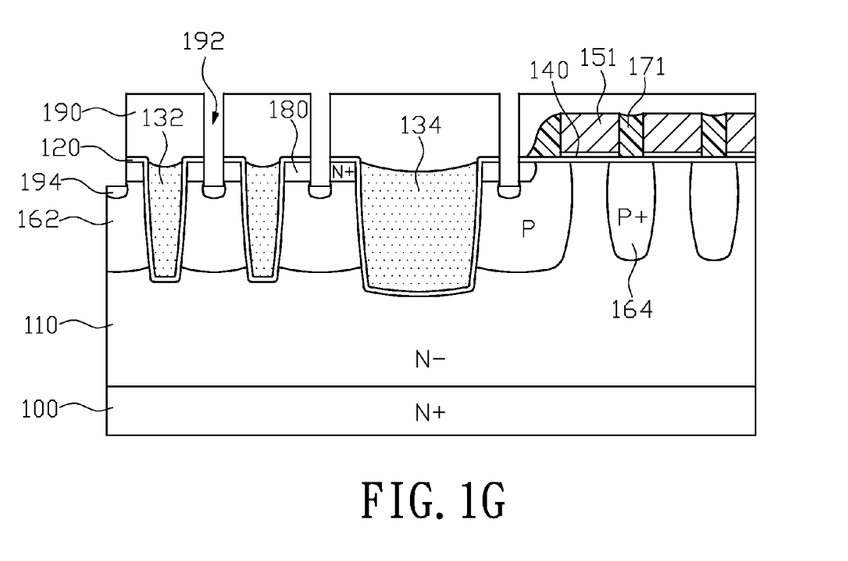

Next, as shown in FIG. 1F, an interlayer dielectric layer 190 is formed to cover the epitaxial layer 110. In the present embodiment, the interlayer dielectric layer 190 also covers the pattern layer 151 and the shielding structure 171. Then, as shown in FIG. 1G, a plurality of source contact windows 192 are formed in the interlayer dielectric layer 190. These source contact windows 192 penetrate the interlayer dielectric layer 190 to expose the source doped regions. Thereafter, a plurality of heavily doped regions 194 are formed at the bottoms of the source contact windows 192. To guarantee the source contact windows 192 can be accurately defined in the interlayer dielectric layer 190, a planar process may be applied to the interlayer dielectric layer 190 prior to the formation of the source contact windows 192. Finally, a metal pattern layer (not shown) is formed on the interlayer dielectric layer 190 to connect the source doped regions 180.

As shown in FIG. 1G, the power semiconductor device fabricated by using the above mentioned fabrication method has a base composed of the heavily doped substrate 100 and the epitaxial layer 110, a plurality of gate structures composed of the gate oxide layer 120 and the polysilicon gate structures 132, a pattern layer 151, at least a body region 162, at least a heavily doped termination structure 164, a shielding structure 171, a plurality of source doped regions 180, an interlayer dielectric layer 190, a plurality of heavily doped regions 194, and a metal pattern layer (not shown).

The pattern layer 151 covers on the epitaxial layer 110 and has at least a first open 152 and a second open 153. The open width of the first open 152 is greater than that of the second open 153. The body region 162 is located in the epitaxial layer 110 below the first open 152. The heavily doped termination structure 164 is located in the epitaxial layer 110 below the second open 153. The body region 162 is kept away from the heavily doped termination structure 164 for a predetermined distance.

The shielding structure 171 fills the second open 153 and has a portion lines at least a sidewall of the first open 152. The source doped regions 180 are located in the body within a range defined by the shielding structure 171 and the pattern layer 151. The interlayer dielectric layer 190 covers the epitaxial layer 110, the pattern layer 151, and the shielding structure 171. The source contact windows 192 penetrate the interlayer dielectric layer 190 to expose the source doped regions 180.

Figure 2:
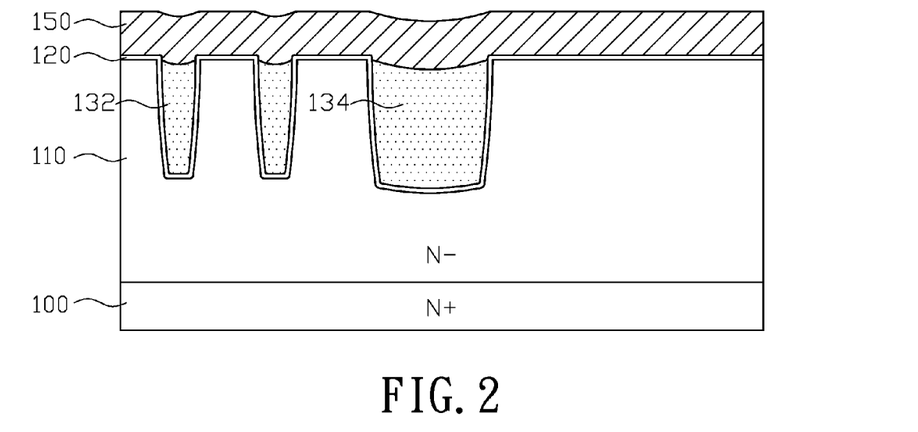
FIG. 2 is a schematic view showing a fabrication method of a power semiconductor device in accordance with a second embodiment of the present invention.

FIG. 2 is a schematic view showing a fabrication method of a power semiconductor device in accordance with a second embodiment of the present invention. Different from the aforementioned embodiment, which has the etching stop layer 140 formed between the pattern material layer 150 and the epitaxial layer 110 prior to the formation of the pattern layer 151, the present embodiment skips the step of forming the etching stop layer 140 and utilizes the gate oxide layer 120 or the epitaxial layer 110 as the etching stop layer.

Figure 3:
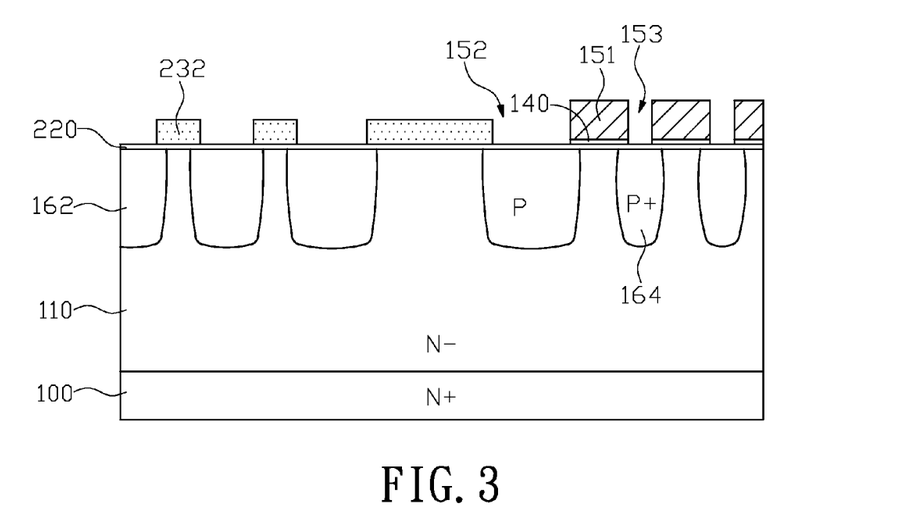
FIG. 3 is a schematic view showing a fabrication method of a power semiconductor device in accordance with a third embodiment of the present invention.

FIG. 3 is a schematic view showing a fabrication method of a power semiconductor device in accordance with a third embodiment of the present invention. Different from the first embodiment and the second embodiment, which are directed to the formation of the trenched power semiconductor devices, the present embodiment as shown is directed to the planar one, which replaces the trenched gate structures with the planar gate structure composed of the gate oxide layer 220 and the polysilicon gate structure 232 on the epitaxial layer 110. The other fabrication steps of the present embodiment are similar to that of the first embodiment and thus are not repeated here.

Figure 4A:
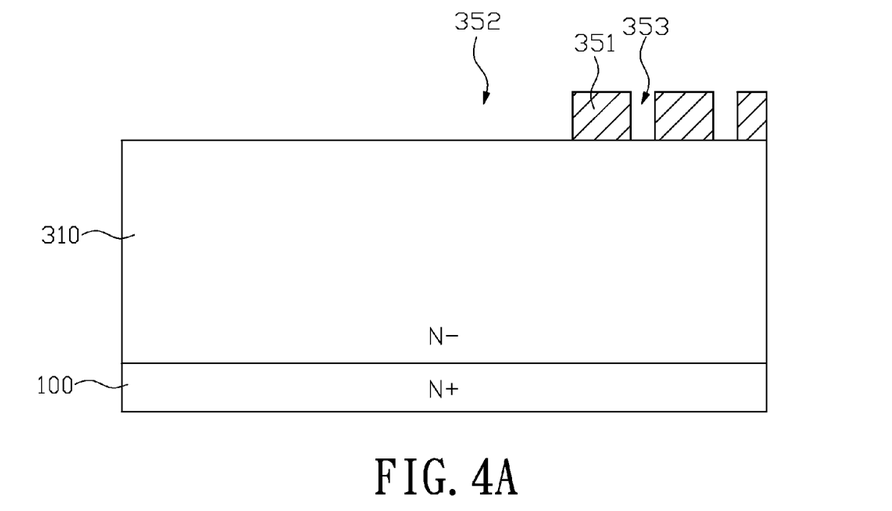
FIGS. 4A to 4D are schematic views showing a fabrication method of a power semiconductor device in accordance with a fourth embodiment of the present invention.

FIGS. 4A to 4D are schematic views showing a fabrication method of a power semiconductor device in accordance with a fourth embodiment of the present invention. Different from the first embodiment of the present invention, which has the gate structure formed in the epitaxial layer 110 prior to the formation of the body region 162, the present embodiment has the body region 362 formed in the epitaxial layer 310 first. As shown in FIG. 4A, before the formation of the gate trenches, a pattern material layer is deposited on the upper surface of the epitaxial layer 310. Then, also referring to FIG. 4B, the locations of at least a body region 362 and at least a heavily doped termination structure 364 are defined on the pattern material layer by using a body mask (not shown). Thereafter, based on the locations defined by the body mask, the pattern material layer is etched to form a pattern layer 351. As shown, the pattern layer 351 has at least a first open 352 with respect to the body region 362 and at least a second open 353 with respect to the heavily doped termination structure 364, and the open width of the first open 352 is greater than that of the second open 353.

Figure 4B:
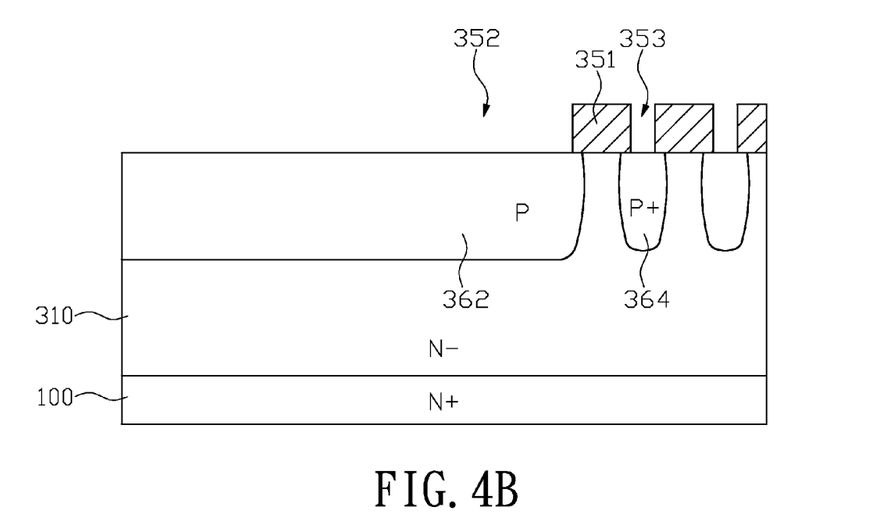

Thereafter, as shown in FIG. 4B, by using the pattern layer 351 as the implantation mask, an ion implantation step is carried out to implant impurities into the epitaxial layer 310 so as to form the body region 362 and the heavily doped termination structure 364 away from the body region 362 with a predetermined distance in the epitaxial layer 310.

Figure 4C:
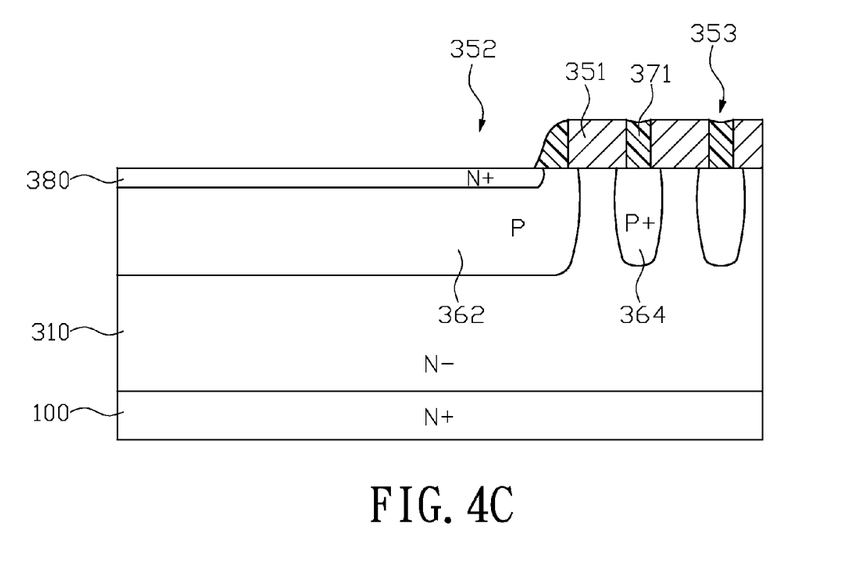

Next, as shown in FIG. 4C, the steps similar to that described in FIGS. 1D and 1E are carried out to form a shielding structure 371 on the epitaxial layer 310. The shielding structure 371 fills the second open 353 in the pattern layer 351 and covers at least a sidewall of the first open 352. Then, by using the integration of the pattern layer 351 and the shielding structure 371 as an implantation mask, a source doped regions 380 is formed in the body region 362. It is noted that, since the bottom of the second open 353 is totally covered by the shielding structure 371, the concentration of the heavily doped termination structure 364 would not be influenced by the present implantation step. In addition, since the shielding structure 371 has a portion covering a sidewall of the first open 352, the resulted source doped region 380 would be totally located in the body region 362 and a sufficient distance between the source doped region 380 and the edge of the body region 362 can be guaranteed.

Figure 4D:
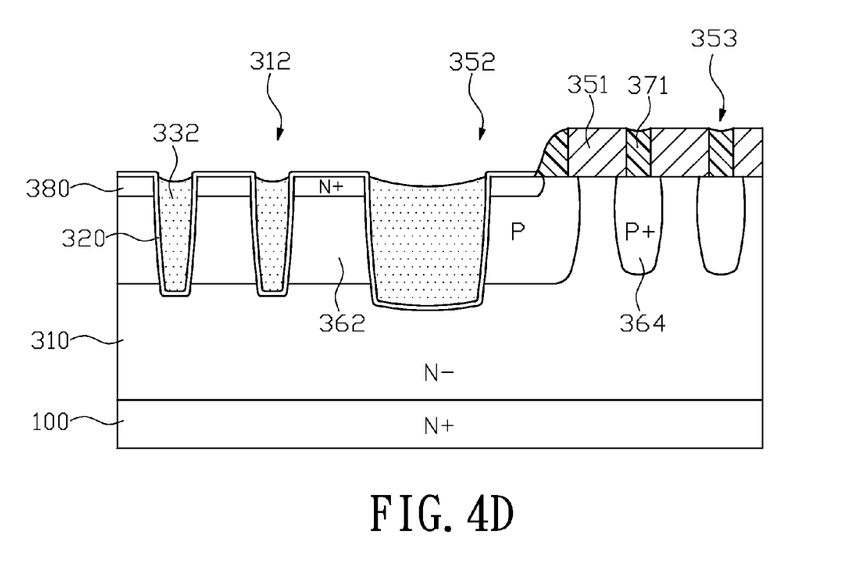

Thereafter, as shown in FIG. 4D, a plurality of gate trenches 312 is formed in the epitaxial layer 310. These gate trenches 312 penetrate the body region 362 as well as the source doped region 380. Then, the gate oxide layer 320 lining the inner surface of the gate trenches 312 and the polysilicon gate structure 332 in the gate trenches 312 are formed so as to finish the fabrication of the trenched gate structure. The following steps of the present embodiment are similar to the aforementioned embodiment and thus are not repeated here.

Figure 5A:
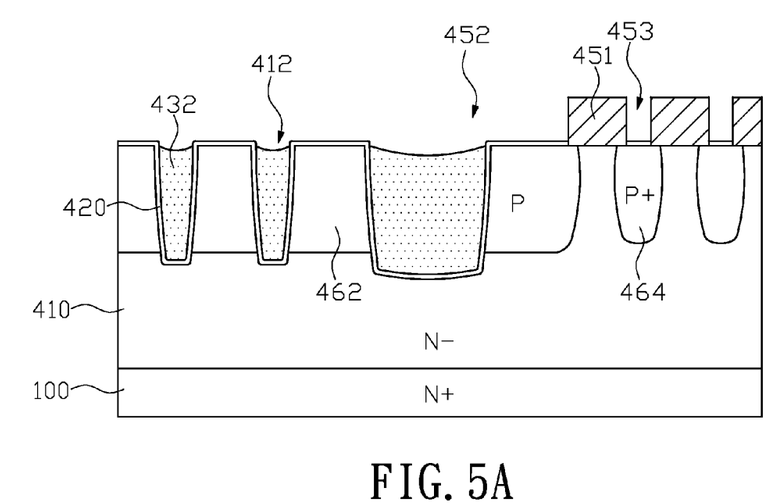
FIGS. 5A and 5B are schematic views showing a fabrication method of a power semiconductor device in accordance with a fifth embodiment of the present invention.
Figure 5B:
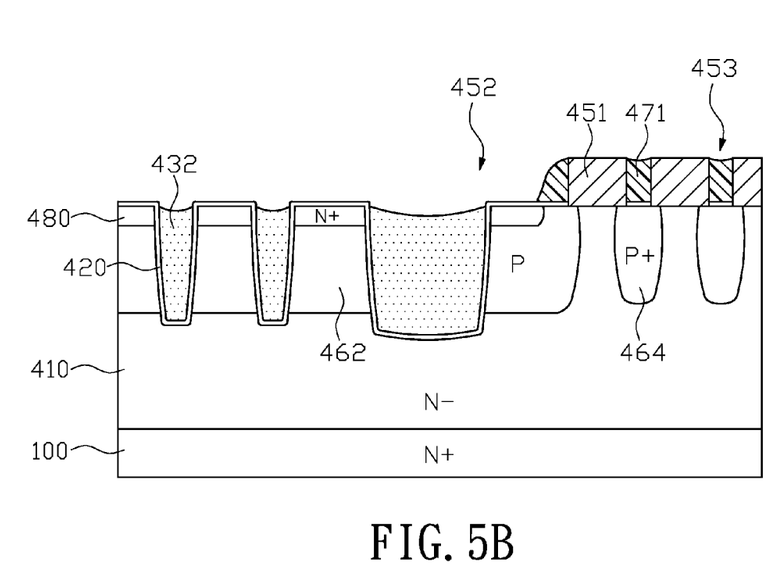

FIGS. 5A and 5B are schematic views showing a fabrication method of a power semiconductor device in accordance with a fifth embodiment of the present invention. Different from the fourth embodiment, which has the source doped regions 380 formed in the body region 362 prior to the step of forming the gate structures, the present embodiment has the gate structure formed right after the formation of the body region 462. FIG. 5A is next to the step of FIG. 4B. As shown in FIG. 5A, after the step of forming the body region 462 and the heavily doped termination structures 464 in the epitaxial layer 410 by using the pattern layer 451, a plurality of gate trenches 412 is formed in the epitaxial layer 410 penetrating the body region 462. Then the gate oxide layer 420 and the polysilicon gate structure 432 are formed in the gate trenches 412 to complete the formation of the trenched gate structures.

Next, as shown in FIG. 5B, a shielding structure 471 is formed on the epitaxial layer 410. The shielding structure 471 fills the second open 453 in the pattern layer 451 and covers at least a sidewall of the first open 452. Then, by using the pattern layer 451 and the shielding structure 471 as an implantation mask, a plurality of source doped regions 480 surrounding the gate trenches 412 are formed in the body region 462. The following fabrication steps, such as the steps of forming the interlayer dielectric layer, source contact windows, or the metal pattern layer, are similar to that in the aforementioned embodiment and thus are not repeated here.

The fabrication method of the power semiconductor device disclosed in the embodiments of the present invention adopts hole-filling ability of thin-film materials and anisotropic etching technology to form the shielding structure 171 filling the holes (the second open 153 described above) in the pattern layer 151 on the termination region such that the mask layer for defining the source doped regions 180 is resulted. Thereby, the masks for defining the body region 162 and the source doped regions 180 can be combined as one to achieve the object of reducing the number of mask.

What is claimed is:

1. A fabrication method of a power semiconductor device, comprising the steps of:
   providing a base;
   forming a plurality of gate structures;
   forming a pattern layer on the base by using a body mask, the pattern layer having at least a first open and at least a second open for forming at least a body region and at least a heavily doped termination structure in the base respectively, and an open width of the first open being wider than that of the second open;
   forming a shielding structure on the base, which fills the second open and covers a portion of a bottom of the first open adjacent to a sidewall thereof;
   forming a plurality of source doped regions by using an implantation mask composed of the pattern layer and the shielding structure;
   forming an interlayer dielectric layer on the base;
   forming a plurality of source contact windows penetrating the interlayer dielectric layer to expose the source doped regions; and
   forming a metal pattern layer on the interlayer dielectric layer to connect the source doped regions.

2. The fabrication method of a power semiconductor device of claim 1, wherein the fabrication step of the shielding structure comprises: depositing a shielding layer on the base and the pattern layer; and anisotropically etching the shielding layer to expose at least a portion of an upper surface of the body region.

3. The fabrication method of the power semiconductor device of claim 1, wherein the step of forming the gate structures is prior to the step of forming the pattern layer.

4. The fabrication method of the power semiconductor device of claim 3, before the step of forming the pattern layer, further comprising the steps of forming an etching stop layer on the base for determining whether the etching step for forming the pattern layer is completed.

5. The fabrication method of the power semiconductor device of claim 1, wherein the step of forming the gate structures is later than the step of forming the body region.

6. The fabrication method of the power semiconductor device of claim 5, wherein the step of forming the gate structures is later than the step of forming the source doped regions.

7. The fabrication method of the power semiconductor device of claim 1, wherein the pattern layer is composed of a material selected from a group composed of polysilicon, silicon oxide and silicon nitride.

8. A power semiconductor device, comprising:
a base; a plurality of gate structures;
a pattern layer, covering the base and having at least a first open and at least a second open, an open width of the first open being much greater than that of the second open;
at least a body region, located in the base below the first open;
at least a heavily doped structure, located in the base below the second open, and the heavily doped structure being away from the body region;
a shielding structure, filling the second open and covering at least a portion of a bottom of the first open adjacent to a sidewall thereof;
a plurality source doped regions, located in a range of the body region defined by the pattern layer and the shielding structure;
an interlayer dielectric layer, located on the base;
a plurality of source contact windows, penetrating the interlayer dielectric layer to expose the source doped regions; and
a metal pattern layer, located on the interlayer dielectric layer to connect the source doped regions.

9. The power semiconductor device of claim 8, wherein the gate structures are trenched gate structures located in the base.

10. The power semiconductor device of claim 8, wherein the gate structures are planar gate structures located on the base.

11. The power semiconductor device of claim 8, wherein pattern layer and the shielding structure are composed of different materials.

12. The power semiconductor device of claim 8, further comprising an etching stop layer located between the pattern layer and the base.

13. The power semiconductor device of claim 9, wherein the pattern layer is composed of a material selected from a group composed of polysilicon, silicon oxide, and silicon nitride.

* * * * *